United States Patent [19]

Montanari

[11] Patent Number: 5,182,852
[45] Date of Patent: Feb. 2, 1993

[54] REVERSIBLE PRODUCTION PROCESS FOR ASSEMBLY OF CIRCUIT BOARD AND SUBSTRATE

[75] Inventor: Jean-Louis Montanari, Herbeys, France

[73] Assignee: Societe Francaise de Detecteurs Infrarouges (SOFRADIR), France

[21] Appl. No.: 789,359

[22] Filed: Nov. 8, 1991

[30] Foreign Application Priority Data

Nov. 9, 1990 [FR] France .................. 90 14182

[51] Int. Cl.⁵ .............................. H05K 3/34
[52] U.S. Cl. ........................ 29/840; 29/827; 29/832; 29/841; 428/901; 257/753; 257/758
[58] Field of Search .............. 29/825, 830, 841, 827, 29/832; 357/71; 428/901

[56] References Cited

U.S. PATENT DOCUMENTS

| | | |
|---|---|---|
| 3,622,419 | 11/1971 | London .................... 29/827 X |
| 3,885,304 | 5/1975 | Kaiser et al. .................. 29/832 |
| 3,906,144 | 9/1975 | Wiley ..................... 174/52.2 X |
| 3,993,800 | 11/1976 | Callender . |
| 4,479,367 | 10/1984 | Buller . |
| 4,812,420 | 3/1989 | Matsuda et al. .............. 29/832 X |
| 5,002,818 | 3/1991 | Licari et al. .............. 428/901 X |
| 5,089,878 | 2/1992 | Lee ............................ 357/71 |

FOREIGN PATENT DOCUMENTS 0395487 10/1990 European Pat. Off. .
87/07715 12/1987 World Int. Prop. O. .

*Primary Examiner*—Carl J. Arbes
*Attorney, Agent, or Firm*—Wall and Roehrig

[57] ABSTRACT

Production process for the reversible assembly of an electronic read and/or operating circuit board having a front face with conductive tracks and a rear face which is metallized and an electrically conductive or nonconductive support or substrate which may include metallized conductive tracks. The assembly is achieved by use of an electrically insulating silicone adhesive layer. A conductive foil is interposed between the rear face of the circuit board and the adhesive layer and is connected to a terminal in the support.

6 Claims, 2 Drawing Sheets

REVERSIBLE PRODUCTION PROCESS FOR ASSEMBLY OF CIRCUIT BOARD AND SUBSTRATE

BACKGROUND OF THE INVENTION

The invention relates to a process for producing the reversible or removable assembly of an electronic read and/or operating circuit with an optionally electrically conductive support. More specifically, the invention relates to a process for the assembly of an electronic read and/or operating circuit combined with a detection circuit, with an enclosure having predetermined physical characteristics, especially in respect of temperature.

Although more specifically described within the framework of infrared detectors, the process according to the invention would not have to be restricted to this single embodiment. Any other application of this process of course falls within the field of protection of this invention.

Infrared detectors conventionally function at low temperature, that is to say within a temperature range of between 50 and 130 kelvin (K). In this way, the detectors proper are combined with a cryostatic chamber (cryostat), the cold finger of which contains liquid nitrogen or liquid air, depending on their use temperature, or a cryogenerator device.

The detection device proper fundamentally consists of a first circuit, termed the detection circuit, comprising a specific number of photosites produced collectively by microelectronic techniques on a semiconductor material sensitive to infrared radiation. This electronic detection circuit is in permanent heat exchange with the cryostat, this exchange being effected via a cold finger.

The utilisation of photon radiation detected by this circuit takes place at the level of a read circuit which is associated with it, this read circuit also being in permanent heat exchange with the cryostat.

Traditionally, the connections between the detection circuit and the read and/or operating circuit are made either by connecting wires or by a collective solder using indium microspheres.

This latter technique, the preferred field of application of the invention, makes it possible to illuminate the detection circuits from their rear face, in fact avoiding the use of any bulky connections, which is not very practical in use.

The system comprising the detection circuit connected to the read and operating circuit is conventionally termed "detection block".

This detection block, in permanent heat exchange with the cold plane of the cryostat, is kept mechanically and thermally in contact with the latter via an interface generally consisting of an insulating support of the ceramic type, the bond between this support and the detection block being produced by means of a conductive adhesive bond, formed, for example, of epoxide resin containing metal fillers intended to ensure electrical conduction between the rear face of the detection block and more precisely of the read and operating circuit and the cryostat connections. These connections generally consist of tracks engraved or screen-printed on the cold finger. In addition, the ceramic support is itself fixed on the cold plane of the cryostat by means of an electrically insulating adhesive bond, which typically is made of silicone.

For example, in FIG. 1 a diagrammatic representation of such an embodiment, constituting the prior art, has been shown. The cold finger (1) of the cryostat has at its upper end a cold plane (2) intended to ensure the heat exchange between the cryostat proper and the detection block (3, 4), corresponding, respectively, to the read and operating circuit (3) and to the detection circuit (4). In a known manner, the detection circuit (4) is electrically and mechanically connected to the read and operating circuit (3) by means of indium microspheres (15). As can be seen on this FIG. 1, a connecting substrate (5), made of an insulating material, typically of ceramic or of alumina, on which a network of conductive tracks (16) have been engraved or screen-printed, has been interposed between the cold plane (2) and the detection block (3, 4). This connecting substrate (5) is generally fixed on the cold plane (2) of the cryostat by means of a join of electrically insulating adhesive (6). The electrical connection between the engraved or screen-printed tracks (16) on the connecting substrate (5) and tracks engraved on and/or at the periphery of the cold plane (2) is conventionally produced by means of conductive microwires (17).

In addition, the electrical inputs and outputs, in particular on the front face of the detection block, are connected to the conductive tracks of the connecting substrate by means of conductive microwires (7), most often made of gold, which are soldered after sticking the detection block onto the connecting substrate. In addition, an electrical link is produced between the rear face of the detection block, and more particularly of the read and operating circuit (3) which face is in particular metallised, for example with gold, and the connecting substrate (5), said electrical link being produced by means of an electrically conductive adhesive (8).

Finally, the reference numeral (9) shows a conductive track engraved or screen-printed on the cold finger of the cryostat (1) and ending at an external connection block (10).

SUMMARY OF THE INVENTION

Although this arrangement, in particular this contact with the integral whole of the rear face of the detection block, certainly has the advantage of conferring an excellent electrical homogeneity on this contact connection, on the other hand this system, produced in this way, cannot be dismantled at the connecting substrate/detection block combination because of the nature of the conductive adhesive used, and also involves a double connection, on the one hand between the detection block and the connecting substrate and on the other hand between the latter and the engraved tracks on the cold finger. In fact, this gives rise to the production of two soldering series, changing the production yield and therefore the productivity, as well as the resulting reliability of the whole. Moreover, the use of an adhesive based on epoxide resin renders the bond irreversible except by damaging the constituents which it joins. Removability by mechanical means is excluded, the peeling forces necessary to destroy the adhesive bond being higher than 1,000 kg/cm$^2$. Removability by chemical means requires the use of products which are harmful and corrosive with respect to constituents (acids, hot methylene chloride) and have a long period of action, changing the components of the detection block, or even of the cryostat, in an unacceptable manner.

Finally, in numerous applications it is necessary to reduce the size of the cold plane, in particular with regard to the power dissipated, and the size of the cryostat, which is not favourable for the connecting substrate described above.

Now, these characteristics of removability, simplicity of connection and reduced sizing are actively sought by the users of such detection circuits, taking into account the very high price of cryostats and other specific systems. In this way, and to date, if a circuit is not functioning correctly or if it is desired to modify some of its characteristics, it is necessary to provide for total replacement of the system unless, as described above, a connecting substrate which may be fixed reversibly thereto on the cold plane (2) of the cryostat is provided.

The invention aims to alleviate these disadvantages. It proposes a process suitable for allowing the reversible or removable assembly of an electronic circuit and an optionally electrically conductive support and in particular the cold finger of a cryostat.

This process for the production of the reversible assembly of an electronic read and/or operating circuit, one of the faces of which, termed the front face, has, inter alia, conductive tracks and the other face of which, termed rear face, is metallised, and of an electrically conductive or nonconductive support comprising, in the latter case, metallised conductive tracks, is characterised:

in that this assembly is produced using an electrically insulating silicone adhesive;

and in that a conductive foil emerging from the said rear face, arranged in contact with said metallised rear face and connected to a terminal of the said support, the said terminal being electrically insulated if said support is electrically conductive, is interposed between said adhesive layer and the metallised rear face of the read and operating circuit.

In other words, the invention consists in no longer making use of the electrically conductive epoxide adhesive but in using a silicone adhesive which is also known to have removability properties, in particular by the use of conventional solvents of low corrosiveness, and in resolving the problem of complexity of the connections and of the bulk by integrating, by any means, a conductive sheet or strip with the metallised rear face of the electronic circuit thus forming the rear face contact, which is also termed substrate contact.

According to a particular embodiment of the invention, the optionally electrically conductive support, with which the electronic circuit in question is integrated, comprises the cold plane of the cold finger of a cryostat.

According to an advantageous embodiment of the invention, the conductive foil is a sheet, a wire or a strip of gold or aluminium.

According to a particular embodiment of the invention, the read and/or operating circuit is combined with an infrared detector, together forming the detection block joined in thermal contact with the cold plane of a cryostat by means of an electrically insulating adhesive.

BRIEF DESCRIPTION OF THE DRAWINGS

The way in which the invention may be implemented and the advantages which are derived therefrom will be more clearly apparent from the illustrative embodiment which follows and which is given by way of illustration and in a nonlimiting manner supported by the appended figures.

As already stated.

DETAILED DESCRIPTION OF A PREFERRED EMBODIMENT

Figure 1:
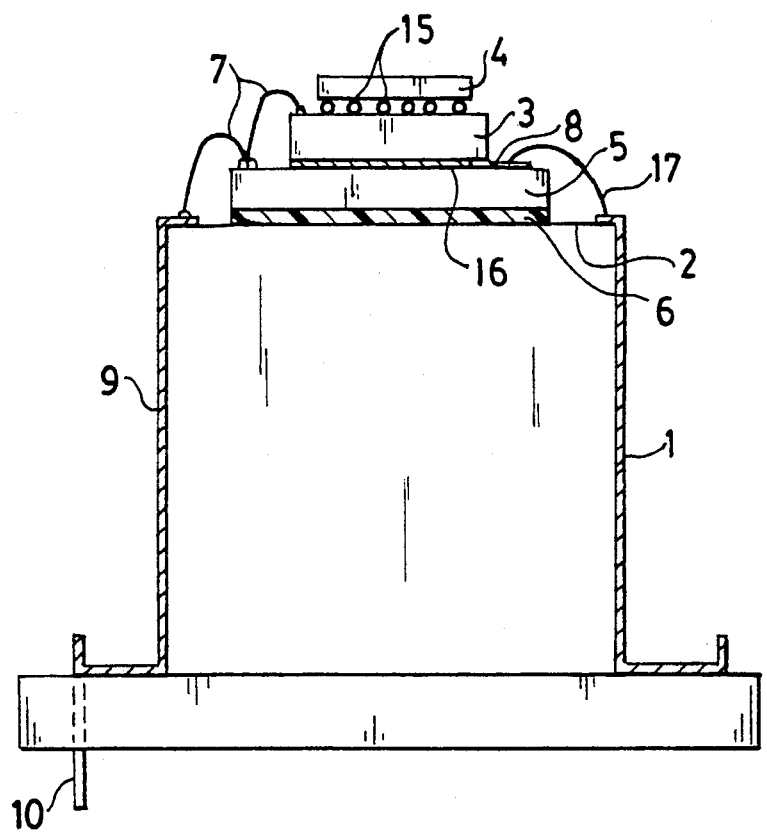
FIG. 1 shows a simplified diagram of an infrared detector combined with the cold finger of a cryostat in accordance with the prior art.
Figure 2:
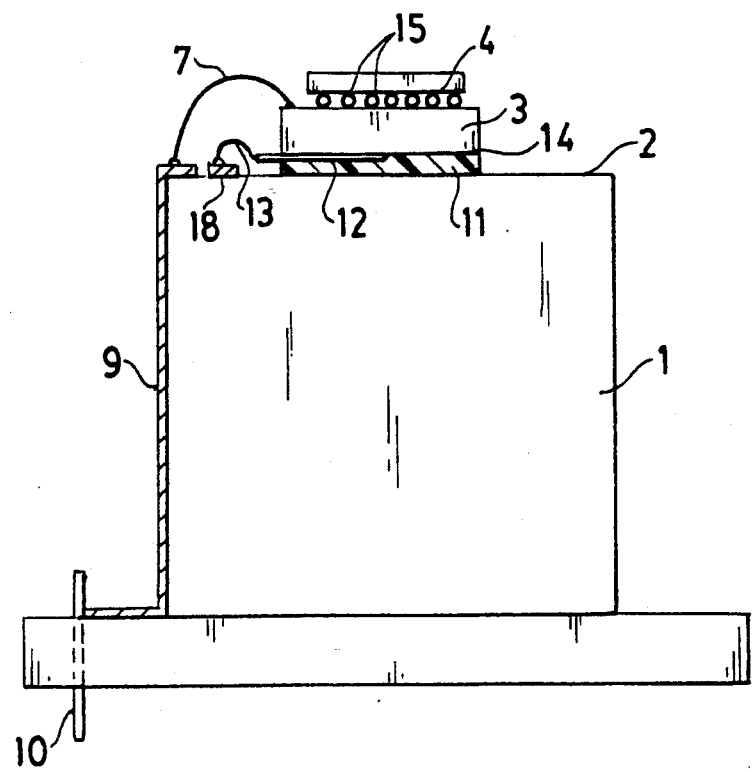
FIG. 2 is a diagrammatic representation of an infrared detector fixed on the cold finger of a cryostat according to the invention.
Figure 3:
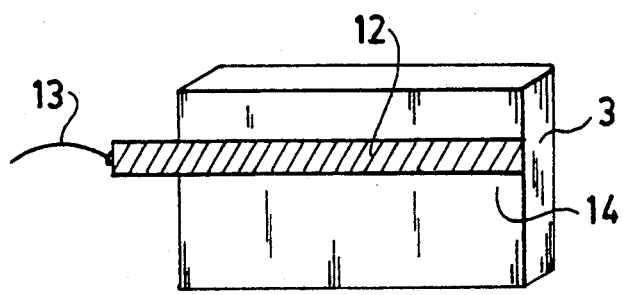
FIG. 3 is a view from below of the electronic read and/or operating circuit according to the invention.

According to the invention, and as has been shown in FIG. 2, the assembly of the detection block, consisting, respectively, of the read and operating circuit (3) in combination with the detection circuit proper (4) with the cold plane (2) of the cold finger (1) of a cryostat, is produced by means of a bond of adhesive (11) consisting of silicone. This adhesive is not electrically conductive. It may consist of the adhesive marketed by Rhône-Poulenc under the trade name RTV 141. This silicone adhesive has an electrical resistivity such that it is absolutely incapable of conductive electricity, at least at the voltages used in this type of detector.

Correlatively, the rear face (14) of the electronic read and operating circuit (3), at which the substrate contact or bulk contact is produced, comprises a sheet of gold or aluminium (12), soldered at the level of its outputs or fixed on said metallised face by means of a spot of conductive adhesive, for example of the adhesive Epotek 417 (trade mark) marketed by Epotecny, and consisting of epoxy adhesive filled with silver particles. This sheet (or wire) (12) extends at least up to the lateral edge of the circuit (3) in order to be able to be connected (13) to a terminal (18), this latter being in electrical connection with a conductive track of the cold finger of the cryostat.

The use of such a silicone adhesive permits easy dismantling of the detection block from the cold finger of the cryostat and more precisely from the connecting substrate. This dismantling may be effected either by a mechanical action, that is to say by a peeling or shearing action with the aid of tweezers (marketed by EREM under reference 5SA) or by a gentle chemical action, such as the use of trichloroethylene at 80° C. for a few minutes, enabling the adhesive bond to be "softened" and causing it to lose its adhesion characteristics.

In this way, if there is felt to be a need, it becomes entirely possible to provide for replacement of a detection block without however necessitating the replacement of the entire cryogenerator installation. Moreover, it is thus possible to avoid making use of a connecting support, which systematically increases the time and thus the cost of the production of such detectors.

As already stated, this process may be applied to other applications, in particular in the field of hybrid circuits in which there is frequently a demand for removability of a system while ensuring electrical contact between one component having a contact rear face (substrate) and a support receiving components, which may be made of any material.

Consequently, bonding by means of silicone adhesive allows direct fixing of the detection block on the cold plane of the detector, taking account of its removability characteristics. In this way, this process has the advantage of reducing the bulk of detection circuits while ensuring the passage of electrical tracks under the component.

I claim:

1. A method of attaching a circuit board to a substrate wherein the front face of the circuit board has conductive tracks thereon and the back face of said circuit board is metalized, the method including the steps of placing a silicone adhesive layer between the back face of the circuit board and a substrate, interposing a conductive foil between the back face of the circuit board and the adhesive layer, and connecting the foil to a terminal mounted upon the substrate.

2. The method of claim 1 wherein the substrate is conductive and further including the step of electrically insulating the terminal from the substrate.

3. The method of claim 1 wherein the substrate comprises the cold plane of a cryostat.

4. The method of claim 1 wherein the foil is formed of gold sheet or wire.

5. The method of claim 1 wherein the foil is formed of aluminum sheet or wore.

6. The method of claim 3 that includes the further steps of providing an operating circuit on the front face of said board and mounting an infrared detection block upon the front face of the circuit board whereby the detection block thermally communicates with the cold plane of the cryostat through the insulating silicon adhesive.

* * * * *